(12) United States Patent
Li

(10) Patent No.: US 8,247,707 B2
(45) Date of Patent: Aug. 21, 2012

(54) SHIELDING ASSEMBLY

(75) Inventor: Jiunn-Her Li, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 109 days.

(21) Appl. No.: 12/975,223

(22) Filed: Dec. 21, 2010

(65) Prior Publication Data

US 2011/0186343 A1    Aug. 4, 2011

(51) Int. Cl.
*H05K 9/00* (2006.01)

(52) U.S. Cl. .......................... 174/382; 174/377; 361/816

(58) Field of Classification Search .................. 174/377, 174/382, 385; 361/816, 800
See application file for complete search history.

(56) References Cited

U.S. PATENT DOCUMENTS

| | | | | |
|---|---|---|---|---|
| 6,140,577 | A | * | 10/2000 | Rapaich et al. ............... 174/365 |
| 6,233,158 | B1 | * | 5/2001 | Leman .......................... 361/799 |
| 6,274,808 | B1 | * | 8/2001 | Cercioglu et al. ............ 174/371 |
| 6,897,371 | B1 | * | 5/2005 | Kurz et al. ..................... 174/382 |
| 8,076,593 | B2 | * | 12/2011 | Centner et al. ................ 174/382 |
| 2003/0062179 | A1 | * | 4/2003 | West ............................ 174/35 R |
| 2009/0166081 | A1 | * | 7/2009 | Tsai et al. ..................... 174/350 |
| 2011/0214916 | A1 | * | 9/2011 | Chang ............................ 174/382 |
| 2012/0073873 | A1 | * | 3/2012 | Nash ............................. 174/382 |

* cited by examiner

*Primary Examiner* — Hung Ngo
(74) *Attorney, Agent, or Firm* — Altis Law Group, Inc.

(57) ABSTRACT

A shielding assembly includes a hollow frame, a pair of first resilient clips and a cover. The frame defines a receiving room and includes a pair of opposite first sidewalls, a second sidewall, a third sidewall opposite to the second sidewall, and a plurality of platforms configured along at least two diagonal corners of the hollow frame. Each of the resilient clip includes a clamping portion extending to suspend in the receiving room. The first resilient clips and the platforms are cooperatively defining a pair of guiding grooves. The cover is inserted into the guiding grooves and positioned between the platforms and first resilient clips by the clamping portions and the platforms resisting on two sides of the cover respectively.

8 Claims, 4 Drawing Sheets

SHIELDING ASSEMBLY

BACKGROUND

1. Technical Field

The disclosure generally relates to shielding assemblies.

2. Description of Related Art

In order to protect electronic components on a circuit board of an electronic device from electromagnetic interference (EMI), shielding assemblies are generally employed to cover the electronic components. A commonly used shielding assembly is made by punching a metal piece and soldering the punched metal piece to the circuit board. With this structure, to repair the electronic components, the shield must be disassembled from the circuit board with special tools, which is inconvenient and may become damaged and deformed and becomes unusable in the disassembly process the shield.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
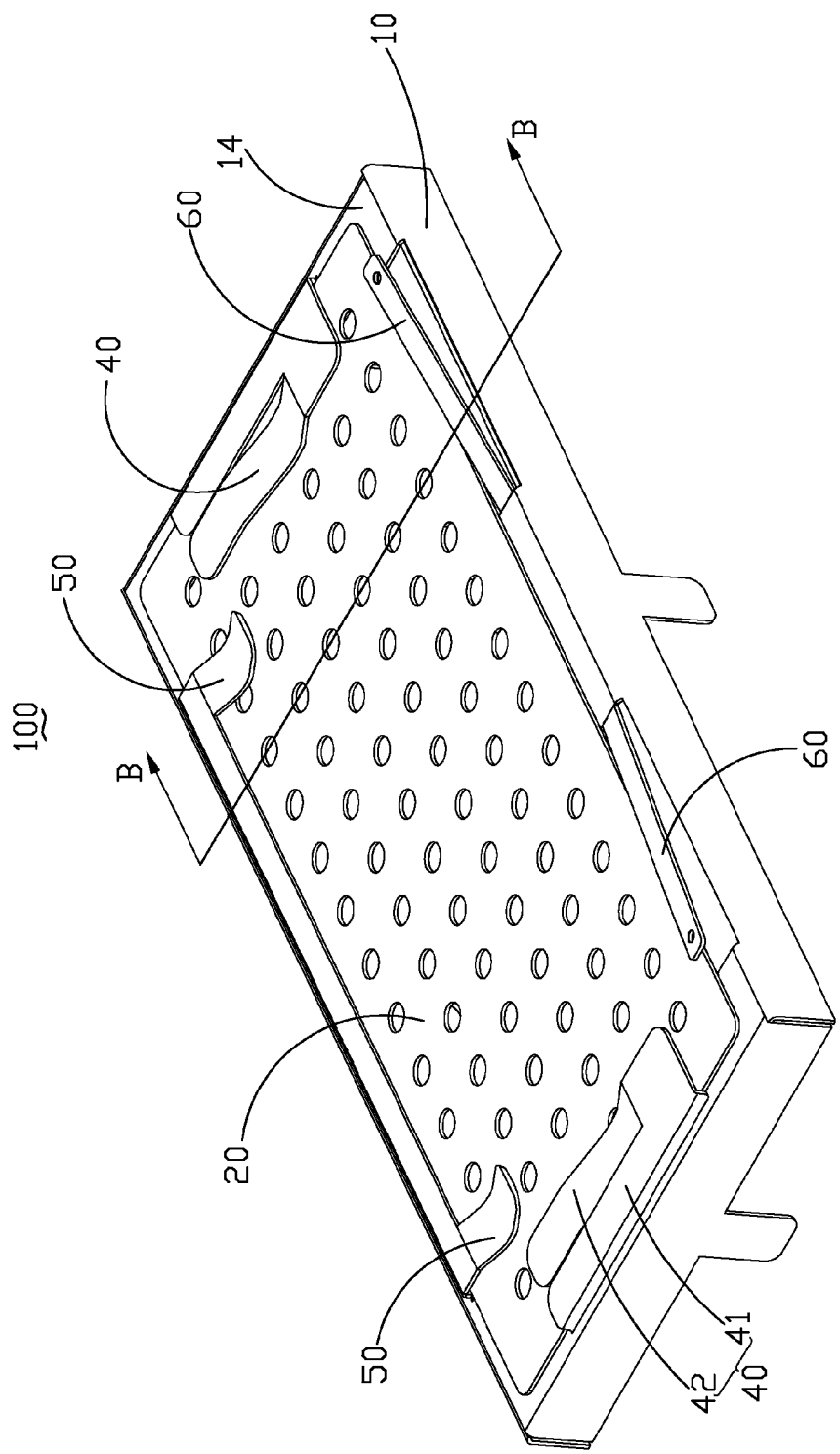
FIG. 1 is a perspective, view of a shielding assembly in accordance with an exemplary embodiment of the disclosure.
Figure 2:
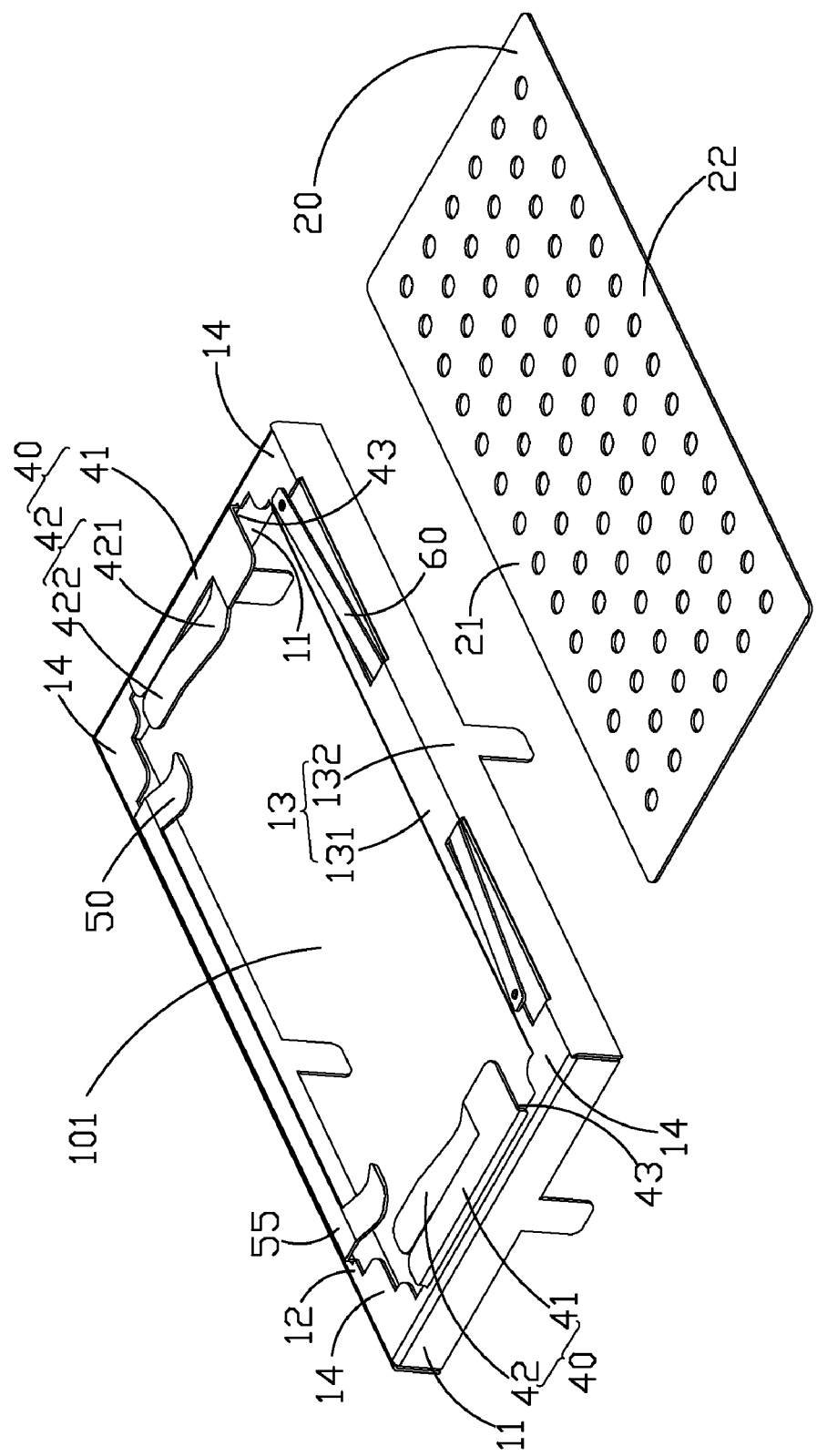
FIG. 2 is an exploded perspective view of the shielding assembly of FIG. 1.

FIG. 1 is a perspective view of a shielding assembly 100 in accordance with an exemplary embodiment of the disclosure. FIG. 2 is an exploded perspective view of the shielding assembly 100 of FIG. 1. The shielding assembly 100 comprises a pair of opposite first sidewalls 11, a second sidewall 12, a third sidewall 13 opposite to the second sidewall 12, a pair of first resilient clips 40 and a cover 20. The sidewalls 11~13 collectively form a hollow frame 10. The hollow frame 10 defines a receiving room 101. A plurality of platforms 14 are configured along at least two diagonal corners of the hollow frame 10.

The pair of first resilient clips 40 extend from the first sidewalls 11 and toward a center of the hollow frame 10, respectively. The first resilient clips 40 and the platforms 14 cooperatively define a pair of guiding grooves 43.

In this embodiment, each of the first resilient clips 40 comprises a guiding portion 41 and a clamping portion 42. The guiding portion 41 is integrally connected between the corresponding first sidewall 11 and the corresponding clamping portion 42. The clamping portion 42 extends from the guiding portion 41 and suspends in the receiving room 101. Each clamping portion 42 comprises a first resisting portion 421 used to resist the cover 20 and a first extending portion 422 extending from the first resisting portion 421 and substantially coplanar with the guiding portion 41. Each clamping portion 42 has a high elasticity performance to resist the cover 20 on the platforms 14.

When the cover 20 is inserted into the guiding groove 43 defined by the platforms 14 and the first resilient clips 40, the clamping portions 42 and the platforms 14 abut against on two opposite sides of the cover 20 respectively to position the cover 20. The cover 20 is moved out by an exterior force and can be reinserted between the platforms 14 and the first resilient clips 40.

Figure 3:
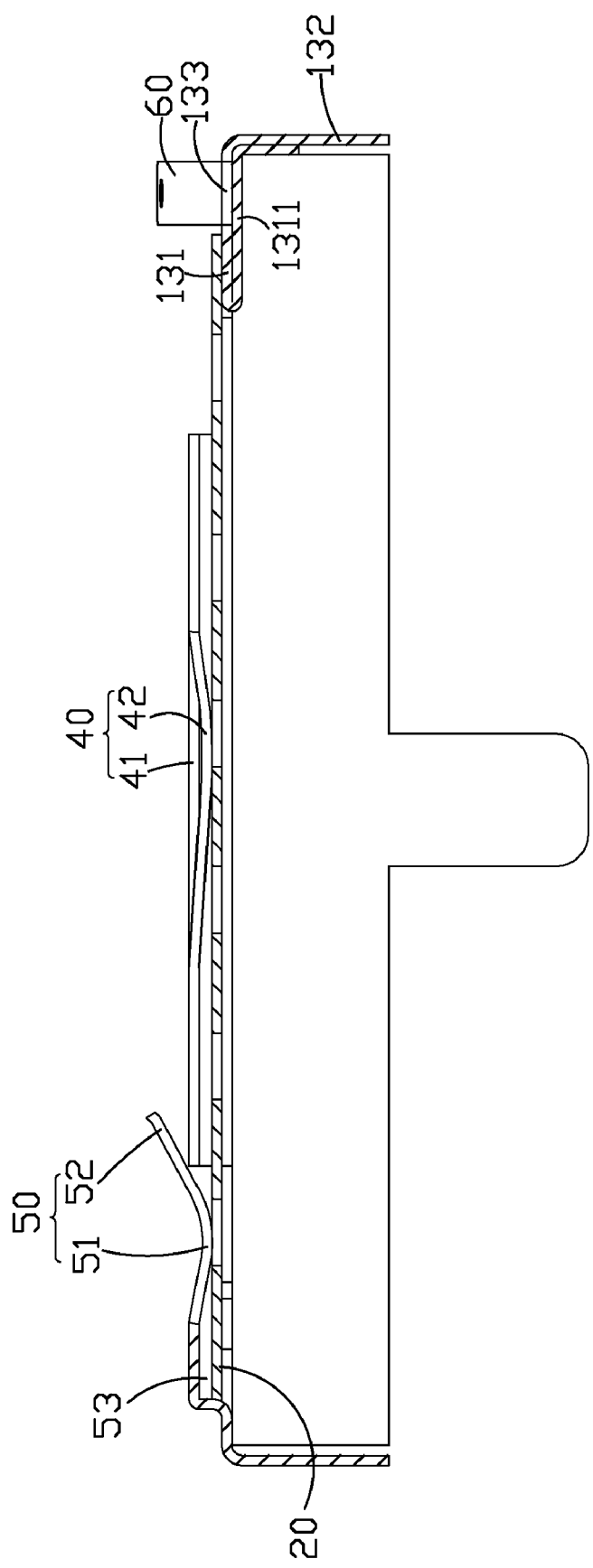
FIG. 3 is a cross sectional view taken along line B-B of FIG. 1.

Referring to FIG. 3, in the illustrated embodiment, the shielding assembly 100 further comprises at least one second resilient clip 50 extending from the second sidewall 12 and suspending in the receiving room 101 to urge the cover 20. The at least one second resilient clip 50 and the second sidewall 12 cooperatively define an accommodating room 53 to receive the cover 20. Each of the second resilient clips 50 comprises a second resisting portion 51 resisting the cover 20 and a second extending portion 52 extending from the second resisting portion 51 and away from the cover 20.

The at least one second resilient clip 50 further comprises a connecting portion 55 integrally connected between the second resisting portion 51 and the second sidewall 12. The connecting portion 55 and the guiding portion 41 are both configured as a flat sheet, and coplanar with each other.

The shielding assembly 100 further comprises at least one third resilient clip 60 configured on the third sidewall 13 to prevent the cover 20 moving away from the frame 10. The third sidewall 13 comprises a first wall 131 to support the cover 20, and a second wall 132 perpendicular to the first wall 131. The at least one third resilient clip 60 is configured on the first wall 131 via cutting the first wall 131 and bending outwardly from the hollow frame 10, thereby at least one cutting hole 133 being formed in the first wall 131. The third sidewall 13 further comprises a folded wall 1311 extending from the first wall 131 and folded inwardly to shield the at least one cutting hole 133.

Figure 4:
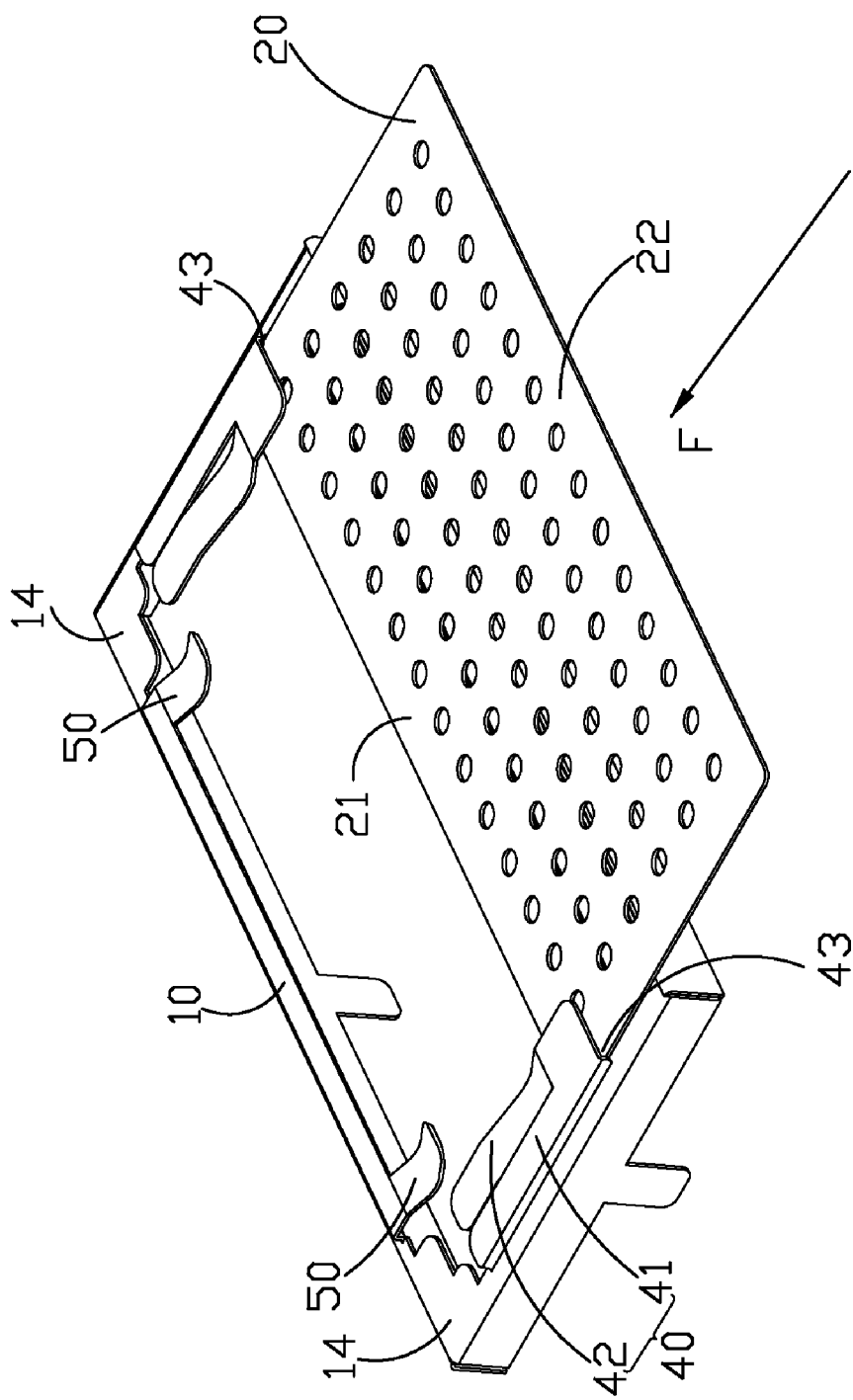
FIG. 4 is a schematic diagram of a cover inserted into a frame of the shielding assembly of FIG. 2.

With reference to FIG. 4, during assembling the shielding assembly 100, the cover 20 is inserted into the guiding grooves 43 by an exterior force F with a first edge 21 of the cover 20 pressing the third resilient clips 60 on the first wall 131. Ultimately, shown in FIG. 1, the first edge 21 of the cover 20 is inserted into the accommodating room 53 and the cover 20 is positioned on the platforms 14 by the pair of first resilient clips 40 and the at least one second resisting clip 50 resisting thereon, thereby the cover 20 being fixed on the hollow frame 10 securely. In this position, a second edge 22 opposite to the first edge 21 of the cover 20 is limited on the hollow frame 10 by the at least one third resilient clip 60. That is, the third resilient clip 60 tilts upwardly with respect to the third sidewall 13 to prevent the cover 20 moving out from the frame 10.

To detach the cover 20 from the frame 10, the third resilient clip 60 is pressed on the first wall 131 and the cover 20 is pull out from the hollow frame 10 along a direction opposite to the inserting direction of the cover 20.

The cover 20 can be detached and attached to the hollow frame 10 easily due to elastic deformability of the first, second resilient clips 40, 50 and the third resilient clip 60, and the shielding assembly 100 can be used many times, which leads to convenience and low cost repairs to the electronic components.

While the exemplary embodiment has been described, it should be understood that it has been presented by way of example only and not by way of limitation. The breadth and scope of the disclosure should not be limited by the described exemplary embodiments, but only in accordance with the following claims and their equivalents.

What is claimed is:

1. A shielding assembly, comprising:
a hollow frame, defining a receiving room and comprising a pair of opposite first sidewalls, a second sidewall, a third sidewall opposite to the second sidewall, and a plurality of platforms configured along at least two diagonal corners of the hollow frame;
a pair of first resilient clips, extending from the first sidewalls and toward a center of the hollow frame, respectively, the first resilient clips and the platforms cooperatively defining a pair of guiding grooves, each of the resilient clips comprising a clamping portion suspending in the receiving room; and
a cover, inserted into the guiding grooves and positioned between the platforms and the first resilient clips by the clamping portions and the platforms used to resist the cover respectively.

2. The shielding assembly as claimed in claim 1, wherein each of the first resilient clips comprises a guiding portion integrally connected between the corresponding first sidewall and the corresponding clamping portion, the guiding grooves are formed between the guiding portions and the platforms.

3. The shielding assembly as claimed in claim 2, wherein each of the clamping portions comprises a first resisting portion urging the cover, and a first extending portion extending from the first resisting portion and substantially coplanar with the guiding portion.

4. The shielding assembly as claimed in claim 3, further comprising at least one second resilient clip extending from the second sidewall and suspending in the receiving room to urge the cover, wherein the at least one second resilient clip and the second sidewall cooperatively define an accommodating room to receive the cover.

5. The shielding assembly as claimed in claim 4, wherein each of the second resilient clips comprises a second resisting portion resisting the cover and a second extending portion extending from the second resisting portion and away from the cover.

6. The shielding assembly as claimed in claim 5, further comprising at least one third resilient clip configured on the third sidewall to prevent the cover moving away from the frame.

7. The shielding assembly as claimed in claim 6, wherein the third sidewall comprises a first wall to support the cover, and a second wall perpendicular to the first wall, the at least one third resilient clip is configured on the first wall via cutting the first wall and bending outwardly from the hollow frame, thereby at least one cutting hole being formed in the first wall.

8. The shielding assembly as claimed in claim 7, wherein the third sidewall further comprises a folded wall extending from the first wall and folded inwardly to shield the at least one cutting hole.

* * * * *